United States Patent
Wiesbauer et al.

(10) Patent No.: US 7,379,005 B2
(45) Date of Patent: May 27, 2008

(54) APPARATUS AND METHOD FOR SPECTRALLY SHAPING A REFERENCE CLOCK SIGNAL

(75) Inventors: Andreas Wiesbauer, Pörtschach (AT); Luis Hernandez, Madrid (ES); Dietmar Sträussnigg, Villach (AT); Daniel Gruber, Andrä (AT); Richard Gaggl, Pörtschach (AT); Martin Clara, Villach (AT); Stefan Matschitsch, Feistritz (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/516,383

(22) Filed: Sep. 6, 2006

(65) Prior Publication Data
US 2007/0057830 A1     Mar. 15, 2007

(30) Foreign Application Priority Data
Sep. 9, 2005    (DE) ...................... 10 2005 042 710

(51) Int. Cl.
*H03M 1/66* (2006.01)
(52) U.S. Cl. ...................................... 341/144; 327/147
(58) Field of Classification Search ................ 341/143, 341/144; 327/147, 156
See application file for complete search history.

(56) References Cited

U.S. PATENT DOCUMENTS

| | | | | |
|---|---|---|---|---|
| 4,330,759 A | * | 5/1982 | Anderson | 331/14 |
| 6,044,124 A | * | 3/2000 | Monahan et al. | 375/376 |
| 6,111,532 A | * | 8/2000 | Hirano et al. | 341/143 |
| 6,463,092 B1 | * | 10/2002 | Kim et al. | 375/219 |
| 6,987,408 B2 | * | 1/2006 | Kim | 327/158 |

FOREIGN PATENT DOCUMENTS

| | | |
|---|---|---|
| DE | 10327621 | 1/2005 |
| JP | 2001311755 | 11/2001 |

OTHER PUBLICATIONS

German Office Action dated May 9, 2006.

* cited by examiner

*Primary Examiner*—Peguy JeanPierre
(74) *Attorney, Agent, or Firm*—Jenkins, Wilson, Taylor & Hunt, P.A.

(57) ABSTRACT

Clock signal jitter detection circuit for detecting a clock signal jitter in a reference clock signal (CLK), having a switched-capacitor reference digital-analogue converter (15) which is clocked by the reference clock signal (CLK) and which converts a digital input signal into a first current, a current-controlled digital-analogue converter (16) which is clocked by the reference clock signal (CLK) and which converts the digital input signal into a second current, and having a current integrator (18) which integrates the difference between the first current and the second current to produce a signal which indicates the clock signal jitter in the reference clock signal (CLK).

28 Claims, 14 Drawing Sheets

APPARATUS AND METHOD FOR SPECTRALLY SHAPING A REFERENCE CLOCK SIGNAL

BACKGROUND OF THE INVENTION

The invention relates to an apparatus and a method for spectrally shaping a reference clock signal for a converter, particularly for a digital-analogue converter, which is provided in the feedback loop of a sigma-delta modulator.

Clock signal jitters are a source of error in converters, particularly in clocked digital-analogue converters. Digital-analogue converters may, inter alia, also be used in feedback loops in sigma-delta analogue-digital converters.

FIG. 1 shows a block diagram of a sigma-delta analogue-digital converter based on the prior art. The analogue-digital converter ADC converts an analogue input signal into digital data or into a digital data stream. These data are then processed further and stored. The analogue-digital converter quantizes the continuous analogue input signal both in terms of time and in terms of amplitude. The digital output signal is stepped following the conversion. In the case of a sigma-delta analogue-digital converter, as shown in FIG. 1, the analogue input signal X(t) is supplied to a subtractor, which subtracts an analogue feedback signal produced by a digital-analogue converter DAC. The difference signal is integrated by an integrator and is then compared with a threshold value by a comparator. The digital output signal from the comparator is fed back to the digital-analogue converter DAC, which converts a digital output value to produce an analogue voltage which is subtracted from the input signal by means of the subtractor. A digital filter connected downstream of the sigma-delta analogue-digital converter converts the serial and high-frequency bit stream into digital values which reproduce the analogue value at the input of the sigma-delta analogue-digital converter at a lower rate but at a very high resolution. The comparator and the digital-analogue converter DAC are clocked by a reference clock signal. The digital-analogue converter used in the feedback path is conventionally a current-controlled digital-analogue converter.

A drawback of sigma-delta analogue-digital converters based on the prior art is that they are particularly sensitive towards clock signal jitters. If the reference clock signal which clocks the digital-analogue converter DAC fluctuates over time, this clock signal jitter results in noise being injected into the feedback signal. The noise caused by the clock signal jitter is brought about by the slight changes in energy or changes in the area of the pulses generated by the current-controlled digital-analogue converter DAC. By contrast, digital-analogue converters using switched-capacitor technology are based on transfer of charges Q between the capacitors, the charge being almost independent of small variations in the clock signal. However, digital-analogue converters which are produced using switched-capacitor technology have the drawback that they are relatively slow, since the charge reversal operations take a relatively long time. Although current-controlled digital-analogue converters which produce current pulses whose amplitude is proportional to a digital value operate relatively quickly, they are sensitive towards clock signal jitters.

FIG. 2 shows a general block diagram of a conventional digital-analogue converter DAC which is clocked by a reference clock signal $CLK_{ref}$. The digital-analogue converter DAC receives a digital input signal from a data source, which is likewise clocked by the reference clock signal, and converts it into an analogue output signal. The output signal from the digital-analogue converter DAC is a sequence of square-wave pulses which are weighted with the digital input value and which have a predetermined time period $T_s$. If the reference clock signal has a clock signal jitter, the duration of the clock pulses deviates from the ideal instant $T_s$, as shown in FIG. 3. The instants at which the output signal from the current-controlled digital-analogue converter DAC changes can be defined as follows:

$$\tau = nT_s + \beta[n]$$

where $\beta[n]$ is the periodically occurring jitter. The periodically occurring jitter forms a random noise signal with a constant variance which is generated when the reference clock signal $CLK_{ref}$ is produced, for example by a PLL (Phase Locked Loop) circuit. The error signal obtained between the ideal output signal from the digital-analogue converter DAC and the actual output signal is as follows:

$$e(t) = y_{ideal}(t) - y_{real} - (t) =$$
$$\sum_{k=0}^{\infty}(u(t-(\beta[k]+kT_S)) - u(t-kT_S)) \cdot (y[k] - y[k-1])$$

The error signal is shown in FIG. 3B. The area obtained for an error pulse within a sampling interval is as follows:

$$s[n] = \beta[n] \cdot (y[n] - y[n-1])$$

If the integral of the error signal is calculated as the sum of the error signal pulse areas and this is sampled for the instants $T = n \cdot T_s$ then the following integrated error signal q[n] is obtained:

$$q(t) = \int_o^t e(\tau) \cdot d\tau$$

$$q[n] = q(nT_S) = \sum_{k=0}^{n} \beta[k] \cdot (y[k] - y[k-1])$$

The integrated error signal sequence q[n] can be expressed as follows:

$$q[n] = s[n] + q[n-1]$$

Z transformation produces the following:

$$S(z) = (1-z^{-1}) \cdot Q(z)$$

The error signal shown in FIG. 3B is the error caused by the clock signal jitter.

BRIEF SUMMARY OF THE INVENTION

The invention provides an apparatus for spectrally shaping a reference clock signal for a converter, having a detection circuit for detecting a clock signal jitter in the reference clock signal; and having a modulation circuit for modulating the pulse widths of the clock pulses in the reference clock signal on the basis of the clock signal jitter detected by the detection circuit.

The invention also provides a clock signal jitter detection circuit for detecting a clock signal jitter in a reference clock signal, having a switched-capacitor reference digital-analogue converter which is clocked by the reference clock signal and which converts a digital input signal into a first current;

a current-controlled digital-analogue converter which is clocked by the reference clock signal and which converts the digital input signal into a second current; and having a current integrator which integrates the difference between the first current and the second current to produce a signal which indicates the clock signal jitter in the reference clock signal.

The invention also provides a method for spectrally shaping a reference clock signal for a converter, having the following steps:

a clock signal jitter in a reference clock signal is detected; and the pulse widths of the clock pulses in the reference clock signal are modulated on the basis of the detected clock signal jitter.

The invention also provides an apparatus for spectrally shaping a reference clock signal for a converter, having a clock signal jitter detection circuit for detecting a clock signal jitter in the reference clock signal, and having a modulation circuit for modulating the pulse widths of the clock pulses in the reference clock signal on the basis of the clock signal jitter detected by the clock signal jitter detection circuit.

The invention also provides a method for spectrally shaping a reference clock signal for a converter, having the following steps, namely a clock signal jitter in a reference clock signal is detected and the reference clock signal is delayed on the basis of the integrated clock signal jitter.

The invention also provides an apparatus for spectrally shaping the reference clock signal for a converter, having a clock signal jitter detection circuit for detecting a reference clock signal, and a modulation circuit with an integrated signal delay line which delays a reference clock signal on the basis of the integrated clock signal jitter.

The invention also provides a PLL circuit for producing a spectrally shaped clock signal, having a PLL (Phase Locked Loop) control loop which contains a voltage-controlled oscillator circuit whose output signal is fed back via a clock signal jitter detection circuit for detecting a clock signal jitter in the output signal and forms the spectrally shaped clock signal.

The invention also provides a voltage-controlled oscillator for producing a spectrally shaped periodic output signal whose output signal is amplified by a buffer signal amplifier in order to produce a square-wave clock signal which is fed back via a clock signal jitter detection circuit to a signal input of the voltage-controlled oscillator.

The invention also provides a method for producing a clock signal, where a periodic output signal from a voltage-controlled oscillator is fed back via a jitter detection circuit for detecting a signal jitter in the output signal to an input of the voltage-controlled oscillator.

BRIEF DESCRIPTION OF THE FIGURES

Preferred embodiments of the inventive apparatuses for spectrally shaping a reference clock signal and of the inventive method for spectrally shaping a reference clock signal are described below with reference to the appended figures in order to explain features which are fundamental to the invention.

DETAILED DESCRIPTION OF THE INVENTION

Figure 1:
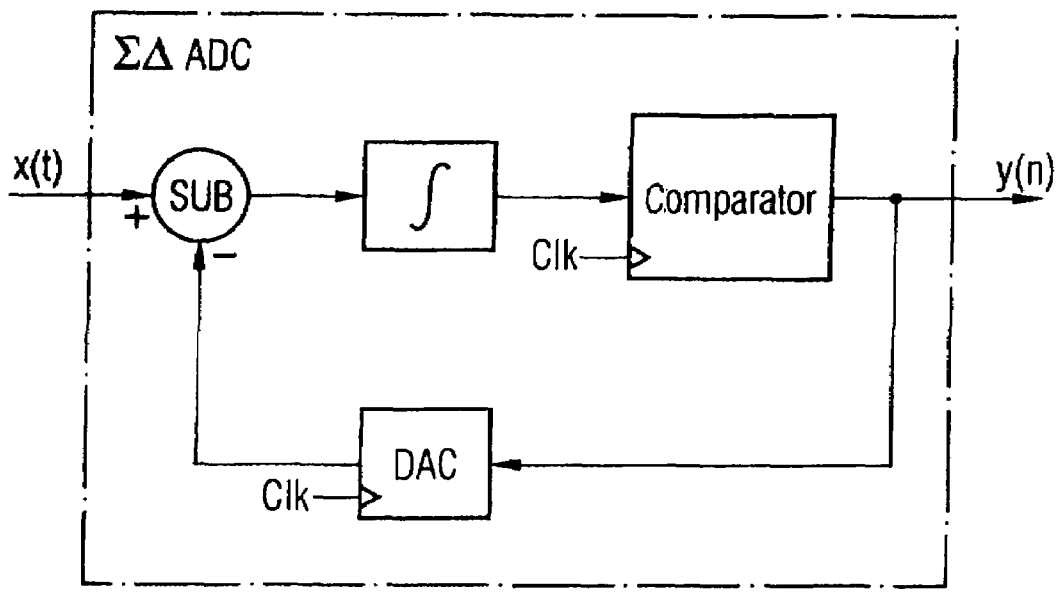
FIG. 1 shows a sigma-delta analogue-digital converter.
Figure 2:
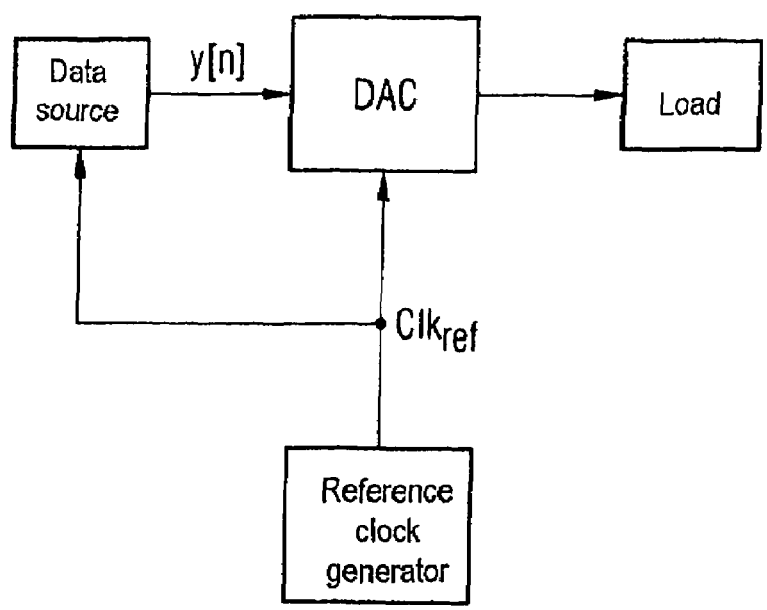
FIG. 2 shows a circuit arrangement for a conventional digital-analogue converter.
Figure 3A:
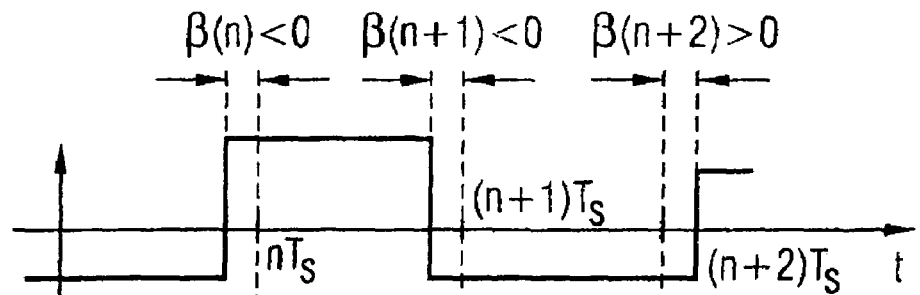
FIG. 3 shows circuit diagrams to explain the problem on which the invention is based.
Figure 3B:
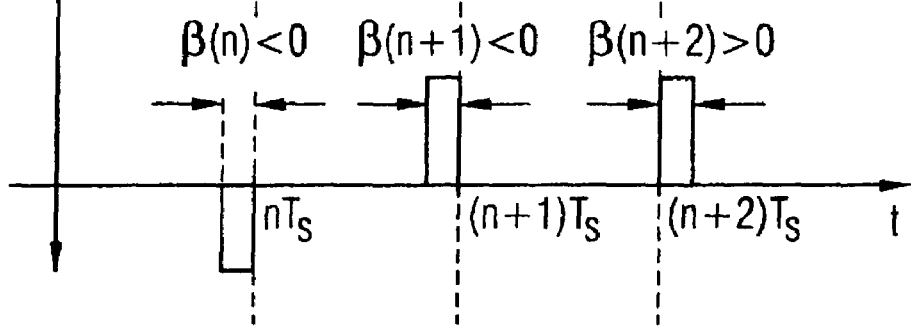
Figure 4:
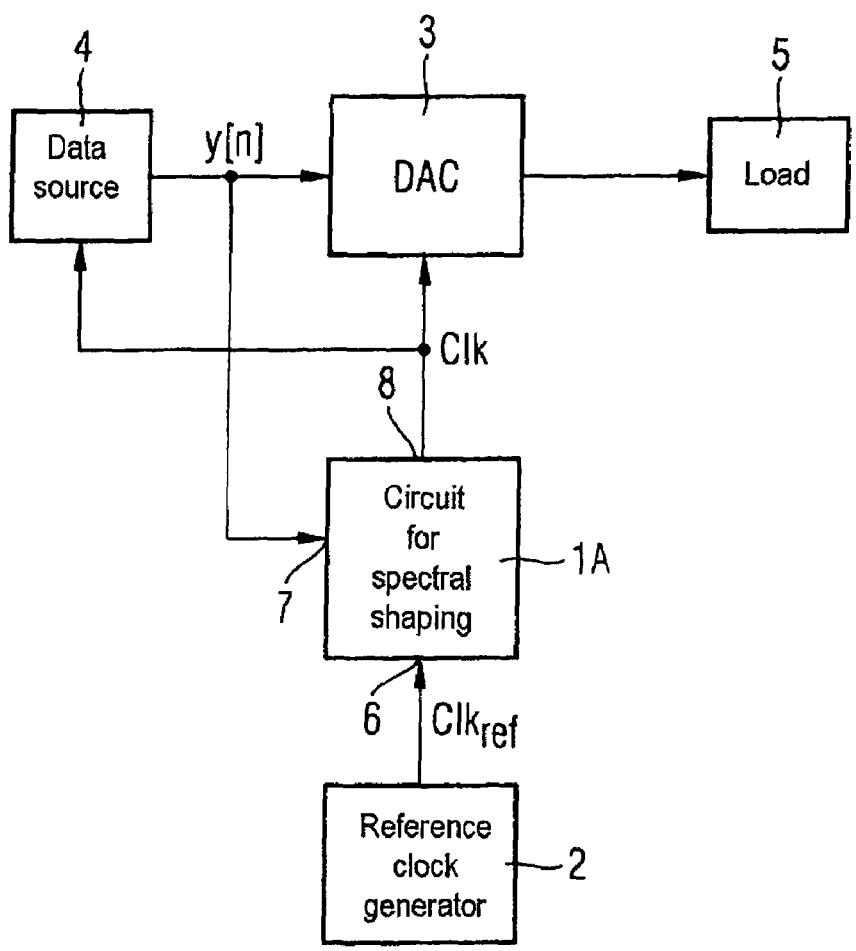
FIG. 4 shows a circuit arrangement with an inventive apparatus for spectrally shaping a reference clock signal.

As can be seen from FIG. 4, the inventive circuit or apparatus 1 for spectral shaping is connected between a reference clock generator 2 and a digital-analogue converter 3. The reference clock signal generator 2 generates a reference clock signal $CLK_{ref}$ which has a clock signal jitter. The reference clock signal generator 2 is any desired clock signal generator. The inventive apparatus 1 performs spectral shaping of the reference clock signal $CLK_{ref}$ and outputs an accordingly spectrally shaped clock signal CLK to a clock signal input of the digital-analogue converter 3. The digital-analogue converter 3, which is clocked with the spectrally shaped reference clock signal, converts a digital input signal coming from a data source 4 into an analogue output signal which is output to any desired data sink or load 5. The apparatus 1 receives a digital input signal y. The apparatus 1 receives the reference clock signal at a signal input 6 and outputs the spectrally shaped reference clock signal to the digital-analogue converter 3 via an output 8.

Figure 5:
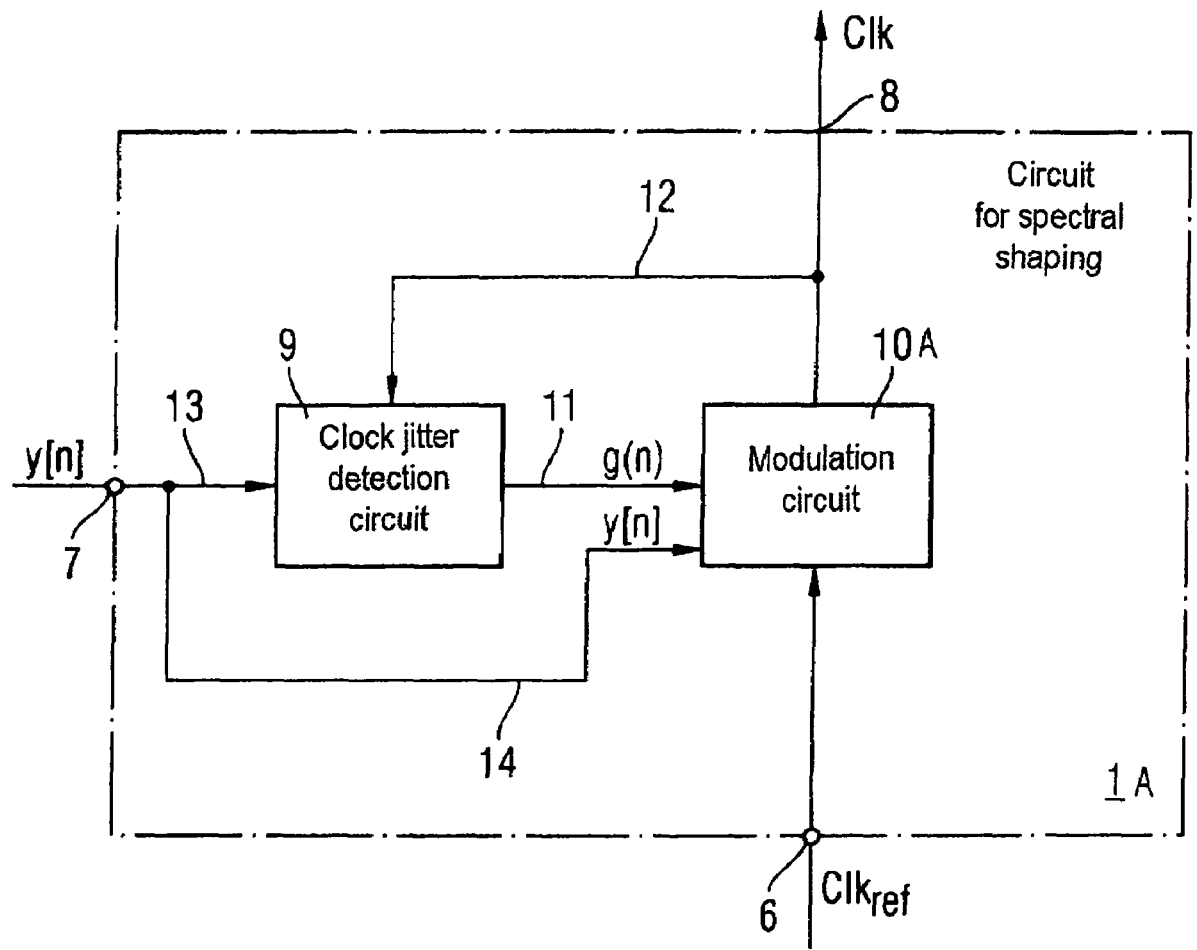
FIG. 5 shows a block diagram to illustrate an embodiment of the inventive apparatus for spectrally shaping a reference clock signal.

FIG. 5 shows a block diagram of a preferred embodiment of the inventive apparatus 1 for spectrally shaping a reference clock signal. The apparatus 1 contains a clock jitter detection circuit 9 for the clock signal jitter and a modulation circuit 10, which modulates the pulse widths of the clock pulses on the basis of the clock signal jitter detected by the detection circuit 9.

The inventive apparatus modifies the clock signal such that the conversion errors are shifted to a frequency range in which no data are transmitted. The purity of the clock signal is detected or measured by a detection circuit, and this information is then used to set a variable time delay. The variable time delay is set such that the noise and the distortion which are caused by the clock signal jitter are shaped in the frequency range. In the transmission frequency range, i.e. usually in a low frequency range, the noise is reduced, while in another frequency range, usually a higher frequency range, the noise is amplified.

An advantage of the inventive apparatus is that the spectral shaping of the reference clock signal means that relatively imprecise reference clock signal generators can be used. This allows the technical complexity for implementing the reference clock signal generators to be reduced.

Figure 6:
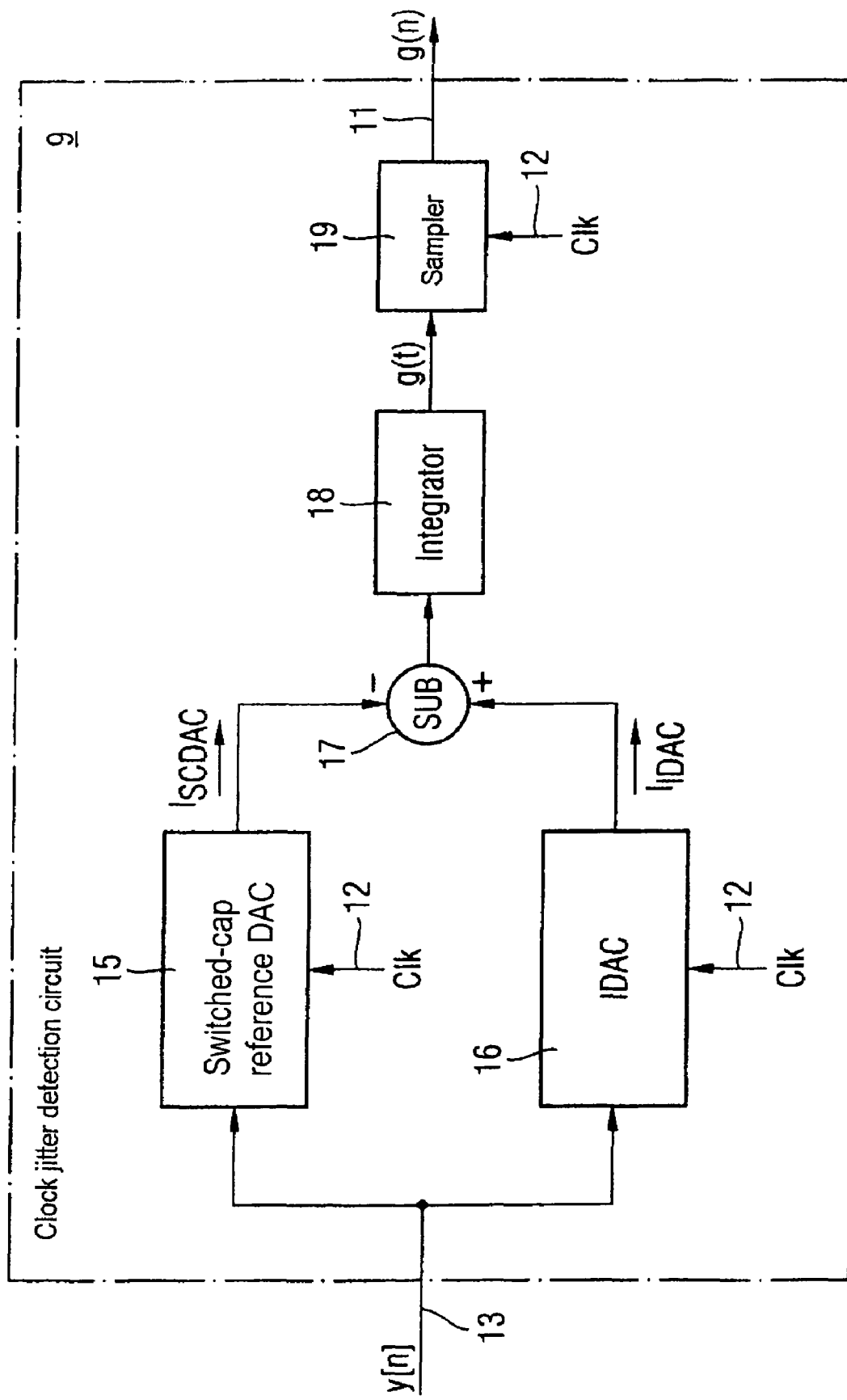
FIG. 6 shows a block diagram of one possible embodiment of the clock jitter detection circuit contained in the inventive apparatus.
Figure 7:
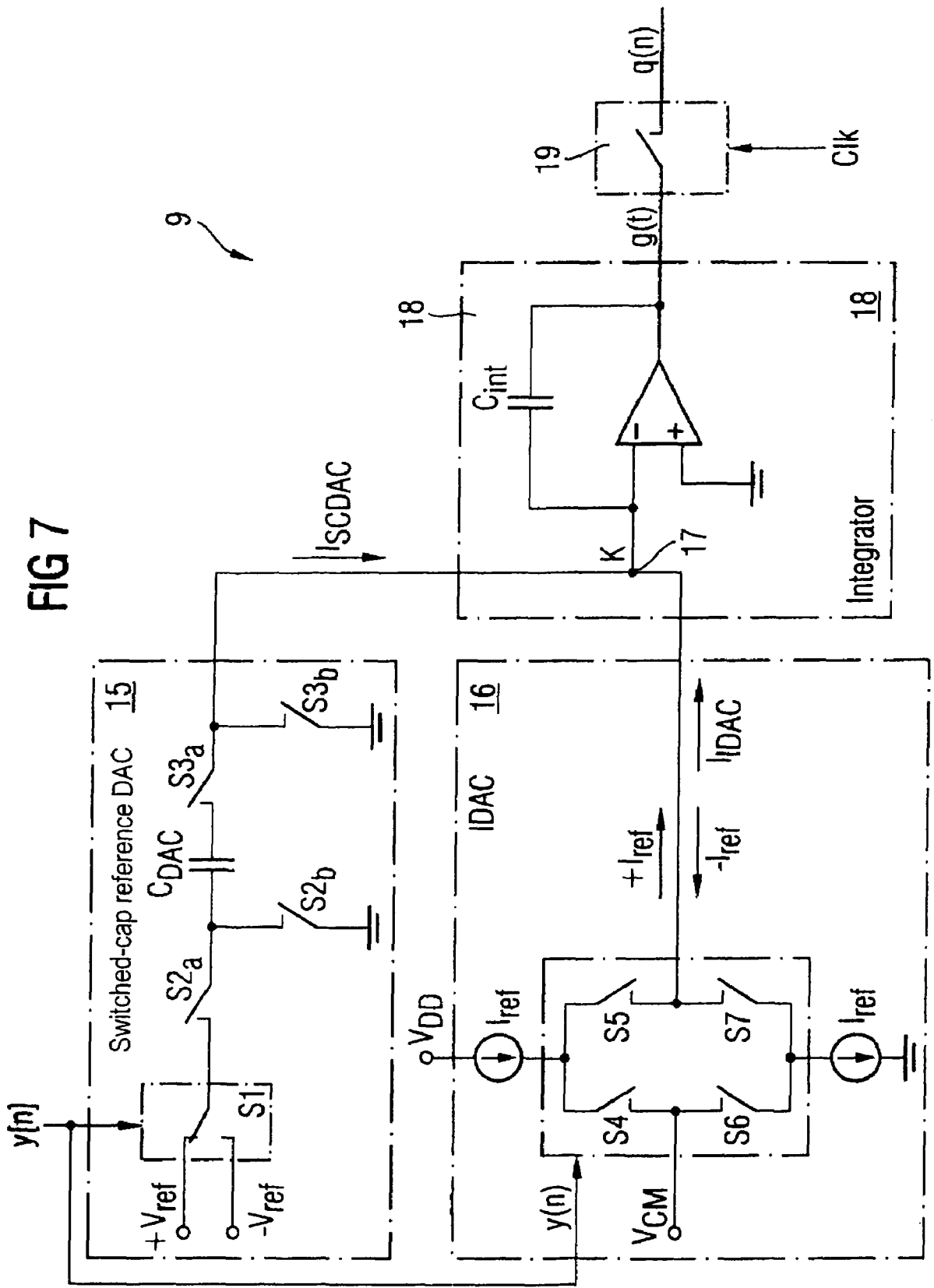
FIG. 7 shows a circuit diagram for one possible embodiment of the clock jitter detection circuit shown in FIG. 6.

One possible embodiment of the clock jitter detection circuit 9 is shown in FIGS. 6 and 7.

Figure 9:
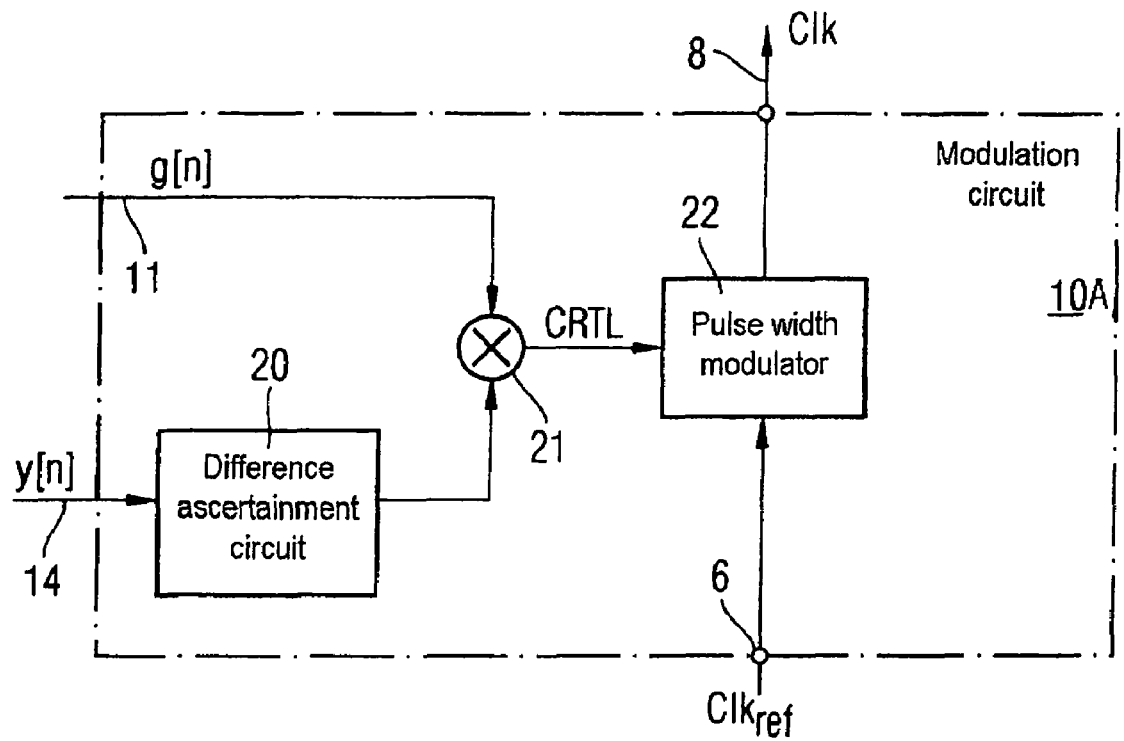
FIG. 9 shows a block diagram of a first embodiment of the modulation circuit contained in the inventive apparatus.
Figure 10:
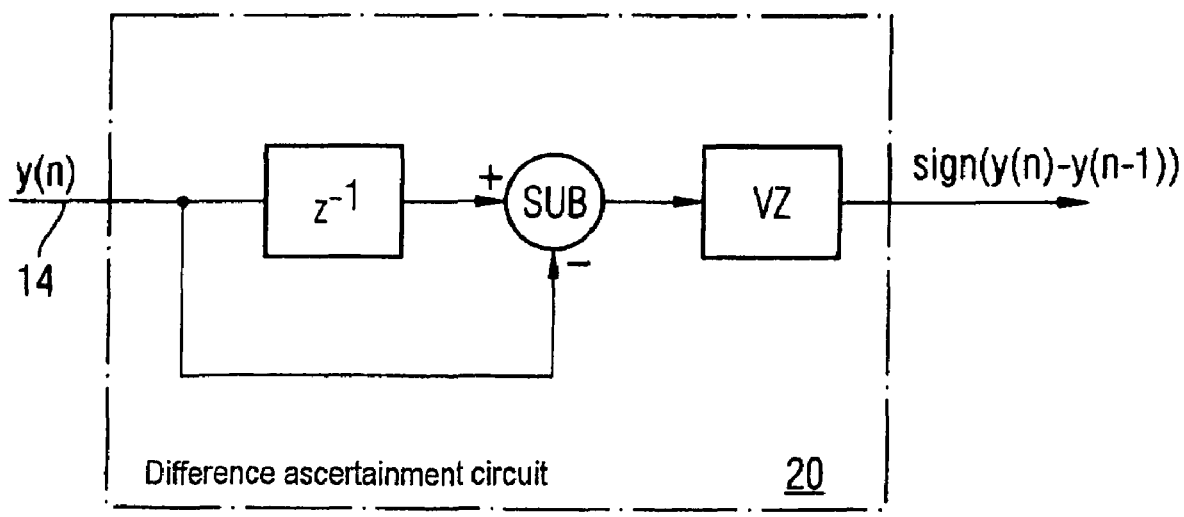
FIG. 10 shows a block diagram of the difference ascertainment circuit contained in the modulation circuit based on its first embodiment.

One possible embodiment of the modulation circuit 10 is shown in FIGS. 9 and 10.

The clock jitter detection circuit 9 outputs a sampled integrated difference current q[n] to the modulation circuit 10 via a control line 11, the sampled integrated difference current indicating a clock signal jitter in the reference clock signal. The clock signal CLK spectrally shaped by the modulation circuit 10 is fed back to the clock jitter detection circuit 9 by an internal clock signal feedback line 12. Both the clock jitter detection circuit 9 and the modulation circuit 10 receive the digital input signal y[n] which is output by the data source 4 and which is applied to the data input 7 of the apparatus 1. The clock jitter detection circuit 9 receives the digital data signal via an internal data line 13, and the modulation circuit 10 receives the digital input signal via an internal data line 14.

FIG. 6 shows a block diagram of the clock jitter detection circuit 9 as shown in FIG. 5. The clock jitter detection circuit 9 contains two internal digital-analogue converters, namely a switched-capacitor reference digital-analogue converter 15 and a current-controlled digital-analogue converter 16, which are both clocked by the clock signal CLK which is output by the modulation circuit 10. The reference digital-analogue converter 15, produced using switched-capacitor technology, converts the digital input signal into a first current $I_{SCDAC}$.

The current-controlled digital-analogue converter 16 converts the inverted digital input signal into a second current $I_{IDAC}$. A subtractor 17 subtracts the first current $I_{SCDAC}$ from the second current $I_{IDAC}$ and outputs the difference current $I_{DIFF}$ produced to a current integrator 18. The current integrator 18 integrates the difference current $I_{DIFF}$, with the integrated difference current then being sampled by a sampler 19. The sampled integrated difference current q[n] indicates the clock signal jitter in the clock signal CLK.

FIG. 7 shows a preferred embodiment of the clock jitter detection circuit 9.

The reference digital-analogue converter 15 contains a switch S1 which is switched between a positive reference voltage +$V_{REF}$ and a negative reference voltage −$V_{REF}$ on the basis of the digital input signal y[n]. A capacitor $C_{DAC}$ is connected either to the output of the switch 1 or to earth by means of switches S2A, S2B. Switches S3A, S3B are used to connect the capacitor $C_{DAC}$ within the reference digital-analogue converter 15 either to the input of the integrator 18 or to earth. The switches S1, S2A, S2B, S3A, S3B are switched in time with the clock signal CLK. In a first phase or charging phase, the switches S2A, S3B are closed and the capacitor $C_{DAC}$ is charged either to the positive reference voltage +$V_{REF}$ or to the negative reference voltage −$V_{REF}$ on the basis of the digital input signal y. In a second phase, the switches S2A and S3B are opened and the switches S2B and S3A are closed. In this phase, the charge Q which has been charged on the capacitor $C_{DAC}$ is transferred to the integrator 18. In each clock phase, a charge Q which is proportional to the product of the reference voltage $V_{REF}$ and the digital input value y is transferred to the integrator 18. This charge Q is largely independent of any clock signal jitter in the clock signal CLK.

The current-controlled digital-analogue converter 16 contains two reference current sources $I_{REF}$ and four switches S4, S5, S6, S7 which are switched on the basis of the digital input signal y. In the first clock signal phase, the switch S5 is closed, while the switch S7 is open. In this way, a positive reference current flows to the current integrator 18. In the second clock signal phase, the switch S5 is open and the switch S7 is closed, which means that a negative reference current $I_{REF}$ flows to the integrator 18. The switches S4, S6 are respectively connected in complementary fashion relative to the switches S5, S7 and are provided optionally. In an idle state of the current-controlled digital-analogue converter 16, the two switches S5, S7 are open and the two switches S4, S6 are both closed.

Figure 8:
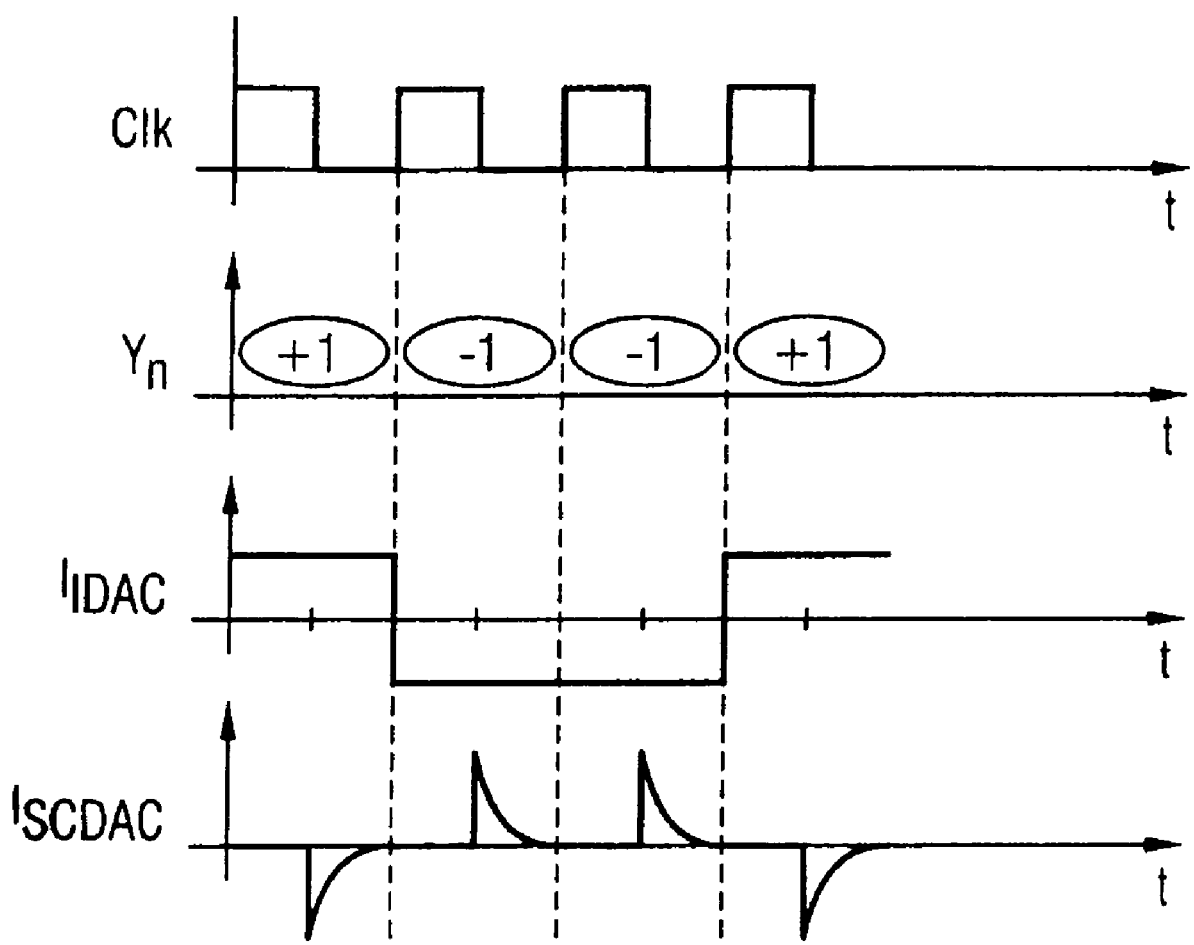
FIG. 8 shows signal timing diagrams to explain the way in which the clock jitter detection circuit shown in FIGS. 6 and 7 works.

FIG. 8 shows the current signals produced by the reference digital-analogue converter 15 and by the current-controlled digital-analogue converter 16 as a function of a digital input signal sequence $y_n$. As can be seen from FIG. 8, a jitter in the clock signal CLK has hardly any effect in the reference digital-analogue converter 15 on account of the exponentially falling current edges, whereas the current which is output by the current-controlled digital-analogue converter 16 is heavily influenced. More precisely, the charge Q transferred from the reference digital-analogue converter 15 is more or less unaffected by a clock signal jitter, whereas the charge Q transferred from the current-controlled digital-analogue converter 16 is proportional to the clock signal jitter which has occurred. If the clock signal jitter is zero then the current-controlled digital-analogue converter 16 outputs the same charge Q to the integrator 18 as the switched-capacitor reference digital-analogue converter 15. In this case, the integrated reference current is zero, i.e. the samples q[n] which are output by the sampler 19 each have the value zero. The greater the clock signal jitter in the clock signal CLK, the greater the difference between the charges Q which are output by the current-controlled digital-analogue converter 16 and the reference digital-analogue converter 15, and the greater the values q[n] which are output by the sampler 19.

Figure 17:
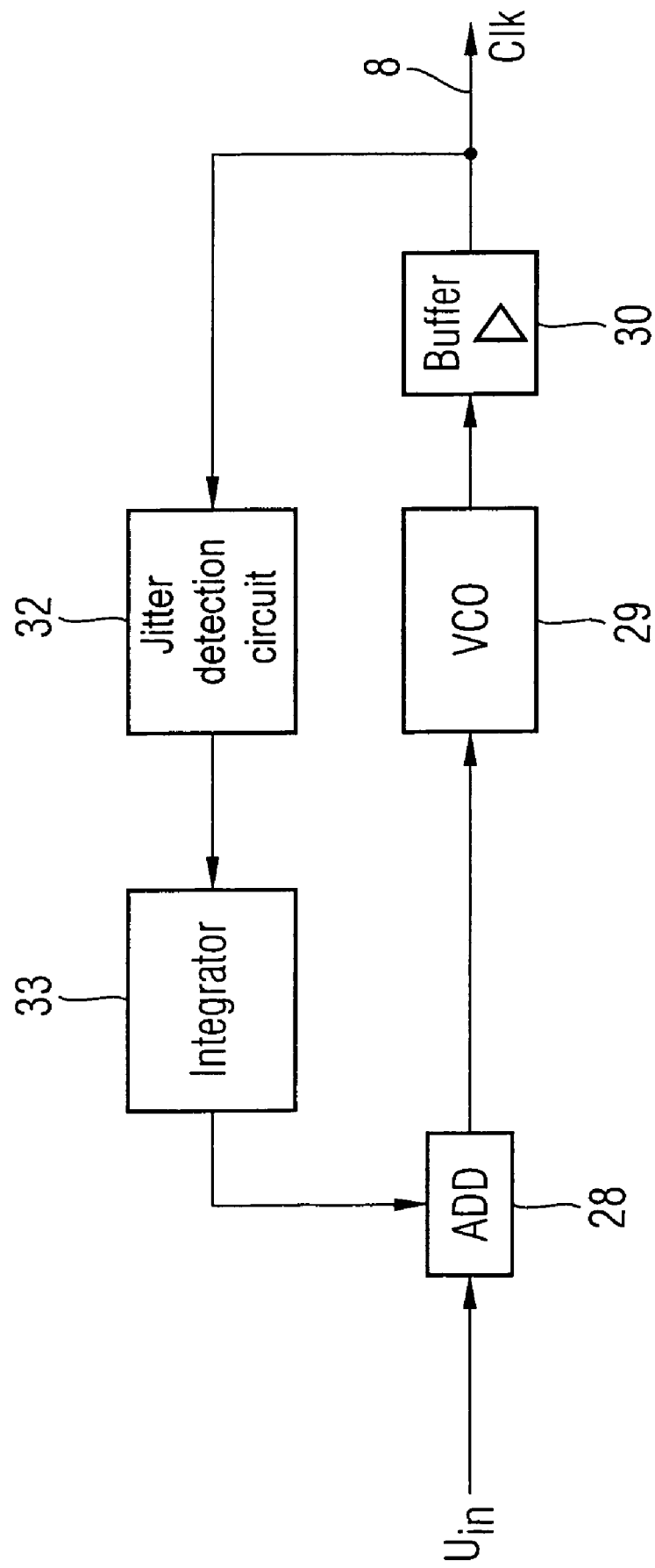
FIG. 17 shows a block diagram of one possible embodiment of an inventive voltage-controlled oscillator for producing a spectrally shaped reference clock signal.

In the case of the preferred embodiment shown in FIG. 17, the current integrator 18 has an operational amplifier whose inverting input is connected to a current node 17. The inverting input of the operational amplifier 18 is at a reference potential. The output of the operational amplifier is connected to the inverting input via a capacitor $C_{int}$.

FIG. 9 shows a preferred embodiment of the modulation circuit 10, which uses the line 11 to receive the signal sequence q[n] indicating the clock signal jitter which has occurred. In addition, the modulation circuit 10 uses the line 14 to receive the digital input signal y[n]. A difference ascertainment circuit 20 ascertains the difference between two successive data values in the digital input signal. A multiplier 21 multiplies the sampled difference current q[n], which indicates the clock signal jitter, by the difference value which is output by the difference ascertainment circuit 20 in order to produce a control signal CRTL. The control signal CRTL actuates the pulse width modulator 22 in the preferred embodiment shown in FIG. 9. The pulse widths of the clock pulses in the reference clock signal $CLK_{REF}$ are modulated on the basis of the control signal CRTL produced in order to produce the spectrally shaped clock signal CLK for the converter 3.

FIG. 10 shows a preferred embodiment of the difference ascertainment circuit 20 within the modulation circuit 10. In a preferred embodiment, it has a delay element, a subtractor and an arithmetic-sign ascertainment circuit VZ. The difference between two successive data values in the data signal y[n] is ascertained and then its arithmetic sign is determined. The arithmetic sign ascertained can either assume the value +1, the value −1 or the value 0. If the input data item y has not changed, the difference is zero and the arithmetic sign which is output likewise has the value zero. In this case, there is no error as a result of clock signal jitter, and the multiplier 21 outputs the value zero to the pulse width modulator 22 as control signal CRTL. In this case, the pulse widths of the reference clock signal are not altered. For a positive signal change, the arithmetic-sign circuit VZ outputs a positive value +1 to the multiplier 21, which multiplies the ascertained arithmetic sign by the clock jitter indicator signal q[n] to produce the control signal CRTL, which is output to the pulse width modulator 22. On the basis of the level of the detected clock signal jitter, the pulse widths of the reference clock signal are extended. If, conversely, a negative signal change has occurred then the pulse widths of the pulse width modulator are shortened.

For the clock signal jitter indicator signal q[n], the following is true:

$$q[n]=\beta[k]\cdot(y[k]-y[k-1])+q[n-1],$$

where β[n] is a noise signal with constant variance which has been caused by the clock signal jitter.
If:

$$\mathrm{sign}(\beta[k]\cdot y[k]-y[k-1])=-\mathrm{sign}(q[n-1])$$

then q[n] has a smaller absolute value than for the converse arithmetic sign. The digital input signal y[n] cannot be altered as a digital input signal, but the pulse width modulator is used to modulate the clock pulse widths of the reference clock signal $CLK_{ref}$ or to alter their length. In this way, the clock signal error is formed through the superimposition of two error components, one being caused by the random clock signal jitter and the other error component being able to be influenced.

The externally induced error component is proportional to q[n−1]:

$$\beta[n]=w[n]-K\cdot q[n-1]\cdot\mathrm{sign}(y[n]-y[n-1]),$$

where w[n] is a random variable which represents the unknown clock jitter component. If just the arithmetic sign of q[n−1] is known then the equation can be presented as follows:

$$\beta[n]=w[n]-G\cdot\mathrm{sign}(q[n-1])\cdot\mathrm{sign}(y[n]-y[n-1]),$$

where G is a gain which can assume three values, namely +G, −G or 0.

The reference clock signal $CLK_{ref}$ is spectrally shaped on the basis of the control signal CRTL by the pulse width modulator 22. In one preferred embodiment of the pulse width modulator 22, it contains a ring oscillator clocked by the reference clock signal for producing an oscillator signal. In addition, the pulse width modulator 22 in this embodiment contains a multiplexer which switches through tapped-off signal phases of the oscillator signal on the basis of the control signal CRTL in order to produce the spectrally shaped clock signal. If the clock signal jitter which has occurred has a positive arithmetic sign then clock pulses extended over time are output. If, conversely, the clock signal jitter has a negative arithmetic sign then shortened clock pulses are output to the converter. The inventive apparatus 1 for spectrally shaping a reference clock signal may be used for any desired digital-analogue converters DAC and for any desired signal generators. The inventive apparatus 1 for spectrally shaping a reference clock signal is particularly suitable for digital-analogue converters DAC which are fitted inside a sigma-delta analogue-digital converter.

Figure 11:
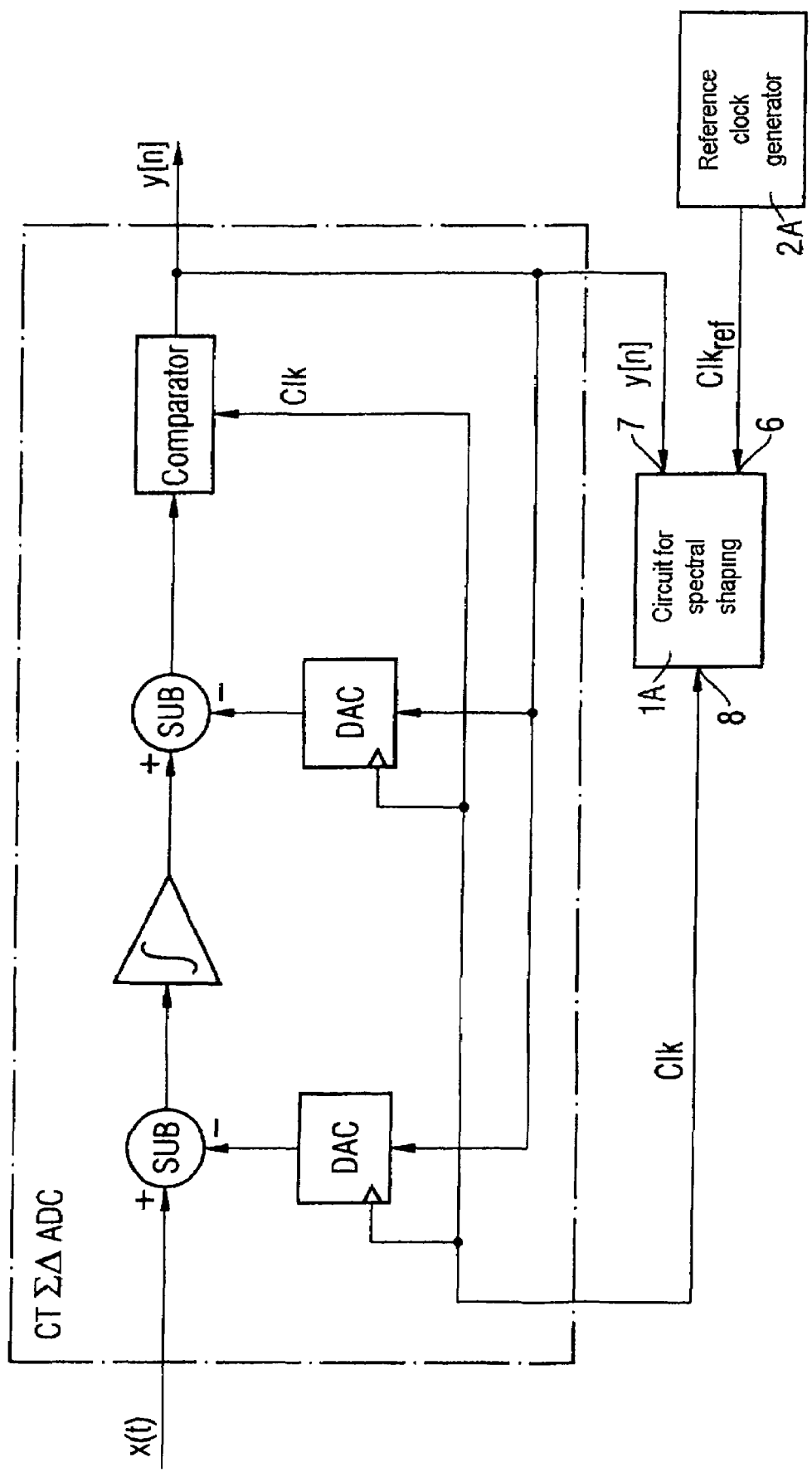
FIG. 11 shows a block diagram of a sigma-delta analogue-digital converter in which the inventive circuit for spectral shaping is used.

FIG. 11 shows the use of the inventive apparatus 1 for spectrally shaping a reference clock signal within a sigma-delta analogue-digital converter. The sigma-delta analogue-digital converter shown in FIG. 11 is a second-order continuous-time sigma-delta analogue-digital converter. The sigma-delta analogue-digital converter has two digital-analogue converters DAC as feedback. The clock signal CLK for the digital-analogue converters DAC are delivered by the inventive apparatus 1. This receives from the reference clock signal generator 2 a reference clock signal $CLK_{ref}$ which is usually subjected to clock signal jitter. Clock signal jitter is detected or measured and a modulation circuit provided within the circuit 1 modulates the pulse widths of the clock pulses in the reference clock signal $CLK_{ref}$ on the basis of the detected clock signal jitter. The spectrally shaped reference clock signal CLK is clocked by the digital-analogue converter DAC in the feedback paths of the sigma-delta analogue-digital converter.

The inventive circuit 1 for spectrally shaping the reference clock signal is suitable both for a single-bit implementation and for a multi-bit implementation of a sigma-delta analogue-digital converter. The inventive circuit 1 allows the use of relatively imprecise reference clock signal generators 2, i.e. clock generators whose clock signal have a relatively large clock signal jitter. It is therefore also possible to use reference clock signal generators 2 with relatively low circuit complexity. These require relatively little chip area for integration and use relatively little power.

Figure 12:
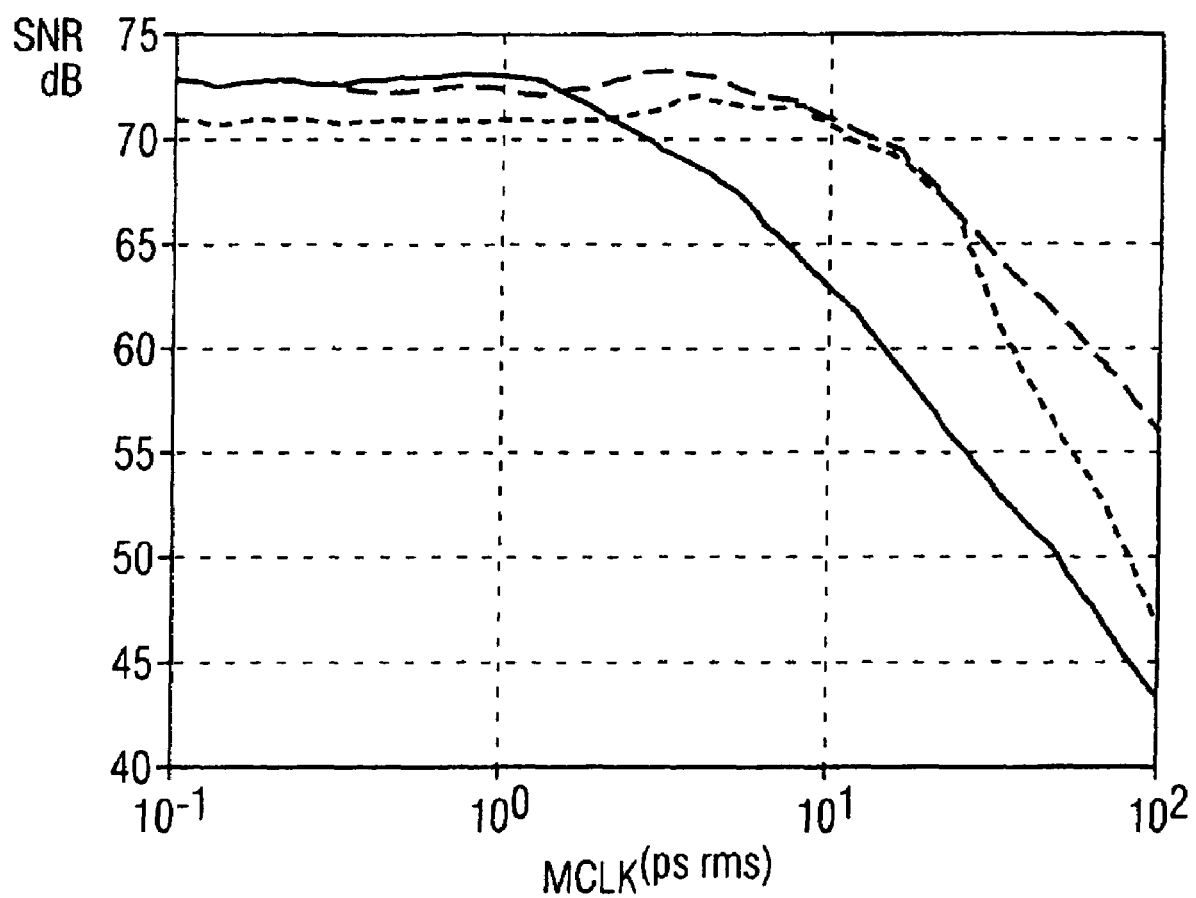
FIG. 12 shows a graph of the signal-to-noise ratio SNR of a sigma-delta modulator with and without the use of the inventive apparatus for spectrally shaping the reference clock signal.

FIG. 12 shows the maximum signal-to-noise ratio SNR for the sigma-delta analogue-digital converter shown in FIG. 11 and a clock frequency of 250 MHz at an oversampling rate R=64. The solid line shows the response of the sigma-delta modulator without the use of the inventive circuit 1 for spectrally shaping the clock signal. The dotted line shows the signal-to-noise ratio SNR when quantized clock pulse modulation is used, and the dashed line shows the signal-to-noise ratio when continuous clock pulse modulation is used. The signal-to-noise ratio SNR is shown as a function of the clock jitter standard deviation τ. As can be seen from FIG. 12, the quantized clock pulse modulation by the inventive circuit 1 allows a much greater level of clock signal jitter, i.e. the sigma-delta analogue-digital converter is far less sensitive towards clock signal jitter in the reference clock signal $CLK_{ref}$. With continuous clock pulse modulation on the basis of the clock signal jitter, the insensitivity of the sigma-delta analogue-digital converter towards clock signal jitter in the reference clock signal is even greater.

Figure 13:
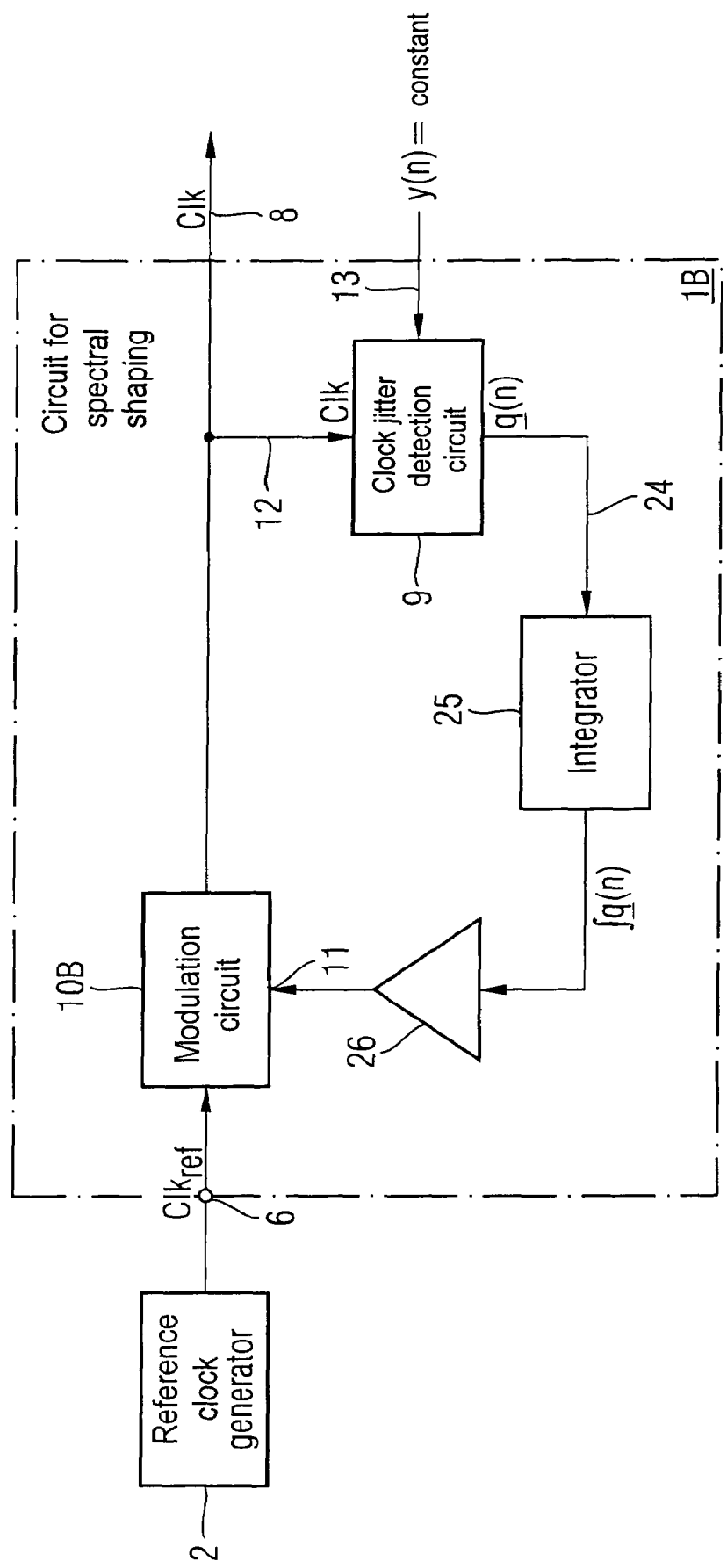
FIG. 13 shows a block diagram of an embodiment of the inventive apparatus for spectrally shaping a reference clock signal.
Figure 14:
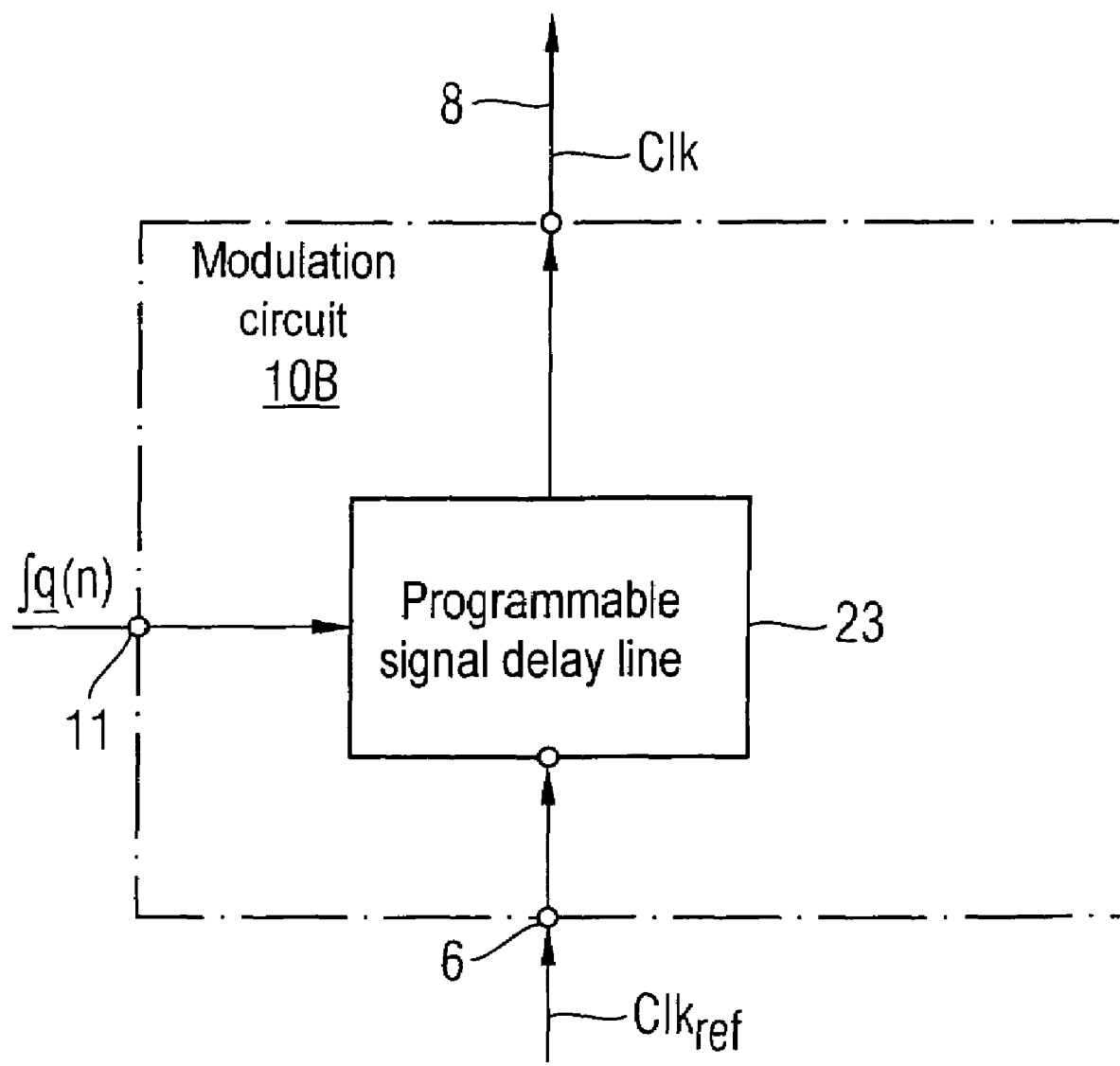
FIG. 14 shows a block diagram of a second embodiment of the modulation circuit contained in the inventive apparatus.

FIG. 13 shows another, possible embodiment of an inventive circuit 1B for spectrally shaping a reference clock signal. A signal input 6 of the circuit 1B for spectral shaping receives a reference clock signal $CLK_{ref}$ which is generated by a reference clock generator 2, for example a crystal. The reference clock signal $CLK_{ref}$ is supplied to a modulation circuit 10B, as shown in FIG. 14. This modulation circuit 10B contains a programmable signal delay line 23 which delays the reference clock signal $CLK_{ref}$ on the basis of an integrated clock signal jitter. The output signal from the programmable signal delay line 23 is applied to a clock signal jitter detection circuit 9, as shown in FIG. 6. In the case of the embodiment of the inventive circuit 1B for spectrally shaping a clock signal which is shown in FIG. 13, the clock signal jitter detection circuit 9 has a constant input signal y(n) applied to it both on the switched-capacitor reference digital-analogue converter 15 and the current-controlled digital-analogue converter 16. The switched-capacitor reference digital-analogue converter 15 and the current-controlled digital-analogue converter 16 are both clocked with the clock signal, delayed in time by the modulation circuit 10B, by means of a clock signal line. The clock jitter detection circuit 9 outputs a discrete-time continuous-value sample sequence q(n) whose amplitude values correspond to the detected clock signal jitter. The output signal from the clock jitter detection circuit 9 is output via a line 24 to an integrator 25 which integrates the sampling signal and applies it to the input 11 of the modulation circuit 10B shown in FIG. 14 via a signal amplifier 26.

In the embodiment shown in FIG. 13, the reference clock signal $CLK_{ref}$ is modulated by delaying the reference clock signal on the basis of the integrated clock signal jitter.

Figure 15:
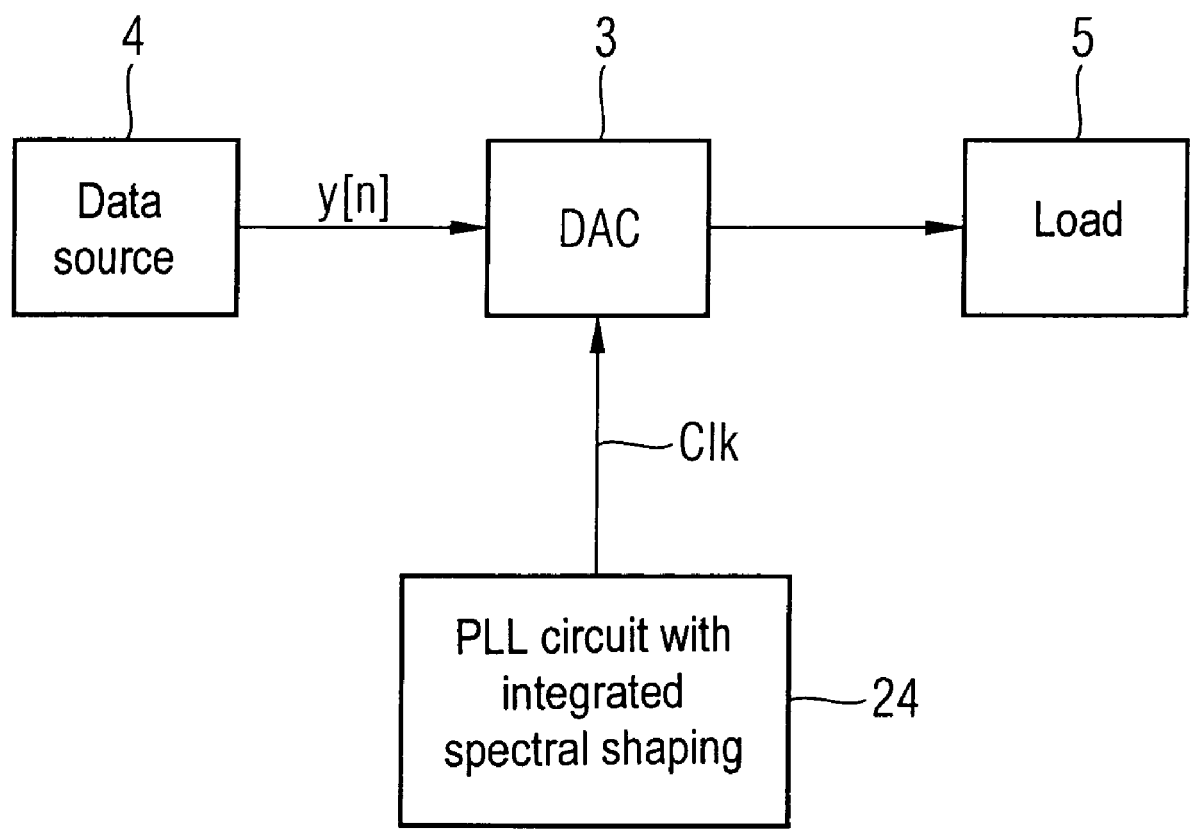
FIG. 15 shows a block diagram of a digital-analogue converter in which a PLL circuit based on the invention with integrated spectral shaping to produce the clock signal is provided.

FIG. 15 shows a circuit arrangement with an inventive PLL (Phase Locked Loop) circuit 24 with integrated spectral shaping of the clock signal which is output by the PLL circuit 24. The spectrally shaped clock signal CLK which is output by the PLL circuit 24 is used for clocking the digital-analogue converter 3 shown in FIG. 15, for example.

Figure 16:
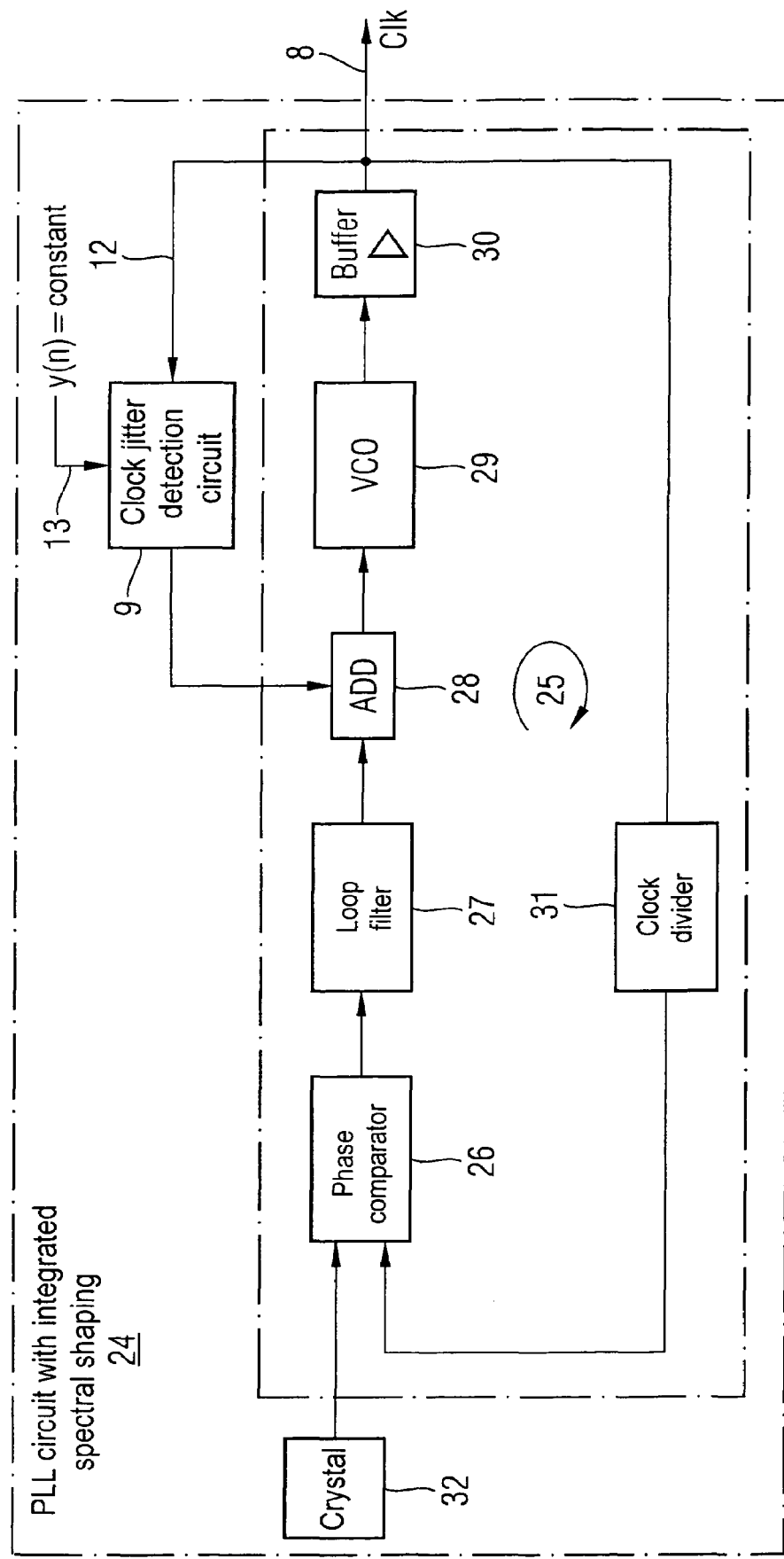
FIG. 16 shows a block diagram of one possible embodiment of an inventive PLL circuit with integrated spectral shaping of a clock signal.

FIG. 16 shows one possible embodiment of the inventive PLL circuit 24 with integrated spectral shaping of the clock signal which is output by the PLL circuit 24. The PLL circuit 24 has two control loops, namely a PLL control loop 25 which comprises a phase comparator 26, a loop filter 27, an adder 28, a voltage-controlled oscillator 29, a buffer signal amplifier 30 and a clock signal divider 31 in the feedback path. In addition, the PLL circuit 24 contains a second control loop, which feeds back a detected signal jitter to the input of the voltage-controlled oscillator 29. This second control loop comprises the adder 28, the voltage-controlled oscillator 29, the buffer signal amplifier 30 and a clock jitter detection circuit 9, as shown in FIG. 6, for example. The two control loops overlap in as much as the adder 28 in the voltage-controlled oscillator 29 and the buffer signal amplifier 30 form part of both control loops.

In one embodiment, the PLL circuit 24 may contain a signal clock generator 32 which generates a reference clock. In an alternative embodiment, the PLL circuit 24 receives the reference clock signal from an external crystal reference clock signal generator. The crystal reference clock generator 32 generates a reference clock signal at a relatively low frequency of 10 MHz, for example. The generated reference clock signal is supplied to the phase comparator 26 of the PLL control loop 25, which compares the signal phase of the reference clock signal with a feedback signal which is output by the clock signal divider 31. A signal which is proportional to the phase error is supplied to the loop filter 27, for example a low-pass filter, which applies the filtered signal to an input of the adder 28. The adder 28 forms a summed signal which is made up of the signal which is output by the clock jitter detection circuit 9 and the signal which is filtered by the loop filter 27. This summed signal is applied to a signal input of the voltage-controlled oscillator 29. The voltage-controlled oscillator 29 generates a periodic output signal whose frequency is proportional to the amplitude of the applied summed signal. The voltage-controlled oscillator 29 produces a sinusoidal periodic output signal, for example. This sinusoidal periodic output signal is applied to a buffer signal amplifier 30 which produces an appropriate square-wave clock signal. This clock signal is applied via a line 12 to the clock signal jitter detection circuit 9, which measures the clock signal jitter of the clock signal. The clock signal jitter detection circuit 9 has the circuit configuration shown in FIG. 6, for example. In this case, the signal input 13 of the clock jitter detection circuit 9 has a constant input signal y(n)=1 applied to it. The reference digital-analogue converter 15 and the current-controlled digital-analogue converter 16 are both clocked by the clock signal which is output by the buffer signal amplifier 30. The output signal from the clock jitter detection circuit 9 is applied to the adder 28. The clock signal which is produced by the PLL circuit 24 and which is output by the buffer signal amplifier 30 has a higher frequency than the reference clock signal which is produced by the crystal generator 32, for example a clock frequency of 100 MHz. Since the clock jitter detection circuit 9 has the measurement of the absolute jitter in the clock signal for a limited measurement bandwidth and does not measure any low-frequency jitter signal information, the inventive PLL circuit 24, as shown in FIG. 16, ensures that the PLL control loop 25 and the feedback loop do not interfere with or influence one another via the clock jitter detection circuit 9. The bandwidth of the feedback loop via the clock jitter detection circuit 9 is much greater than the frequency bandwidth of the PLL control loop 25. If the frequency of the periodic output signal from the voltage-controlled oscillator 29 is 100 MHz and the frequency of the reference clock signal is 10 MHz, for example, then the frequency bandwidth of the control loop for spectral shaping comprises a frequency range of 0 to 50 MHz, for example, and the control bandwidth of the PLL loop 25 comprises just 0 to 5 MHz. Since the bandwidth of the control loop for spectral shaping is much greater than the frequency bandwidth of the PLL loop 25, it is possible to reject radio-frequency interference, in particular, better than with the PLL control loop alone. In the case of the PLL circuit 24 shown in FIG. 16, the jitter noise of the PLL loop 25 is reduced by reducing a phase noise in the noisy voltage-controlled oscillator 29 using the control loop for spectral shaping. To this end, the period jitter or the change in the absolute signal jitter in the periodic output signal which is output by the voltage-controlled oscillator 29 is measured and is fed back as correction value to the signal input of the voltage-controlled oscillator 29 via the control loop using a wide bandwidth.

FIG. 17 shows another possible embodiment of the control loop for spectrally shaping a clock signal. In this embodiment, the measurement circuit does not measure the absolute signal jitter but rather what is known as a period signal jitter, i.e. the change in the signal jitter over time. In this embodiment, the output signal from the voltage-controlled oscillator 29 is measured and is then integrated by an integrator 33 before it is fed back to the adder 28.

The invention claimed is:

1. Clock signal jitter detection circuit for detecting a clock signal jitter in a reference clock signal, the circuit comprising:
    (a) a switched-capacitor reference digital-analogue converter which is clocked by the reference clock signal and which converts a digital input signal into a first current;
    (b) a current-controlled digital-analogue converter which is clocked by the reference clock signal and which converts the digital input signal into a second current; and
    (c) a current integrator which integrates the difference between the first current and the second current to produce a signal which indicates the clock signal jitter in the reference clock signal.

2. Clock signal jitter detection circuit according to claim 1, where the clock signal jitter detection circuit also has a sampling switch adapted for sampling the integrated difference current.

3. Clock signal jitter detection, circuit according to claim 1, where the input signal is a digital input signal.

4. Clock signal jitter detection circuit according to claim 3, where the input signal is a constant input signal.

5. Apparatus for spectrally shaping a reference clock signal for a converter, the apparatus comprising:
    (a) a clock signal utter detection circuit adapted for detecting a clock signal jitter in the reference clock signal, where the clock signal jitter detection circuit comprises:
        a switched-capacitor reference digital-analogue converter which is clocked by the reference clock signal and which is actuated by a digital input signal for the converter in order to produce a first current;
        a current-controlled digital-analogue converter which is clocked by the reference clock signal and which is actuated by the inverted digital input signal in order to produce a second current; and
        a current node which subtracts the first current from the second current to produce a difference current; and
    (b) a modulation circuit adapted for modulating the pulse widths of the clock pulses in the reference clock signal on the basis of the clock signal jitter detected by the clock signal jitter detection circuit.

6. Apparatus according to claim 5, where the clock signal jitter detection circuit adapted for detecting the clock signal jitter in the reference clock signal also has a current integrator for integrating the difference current.

7. Apparatus according to claim 6, where the current integrator contains an operational amplifier, comprising an inverting input which is connected to the current node, comprising a non-inverting input which is at a reference potential, and comprising an output which is fed back via a capacitor to the inverting input.

8. Apparatus according to claim 6, where the clock signal jitter detection circuit also has a sampling circuit clocked by the reference clock signal for sampling the integrated difference current.

9. Apparatus according to claim 5, where the modulation circuit has a circuit adapted for ascertaining a difference between two successive data values in the digital input signal.

10. Apparatus according to claim 8, where the modulation circuit has a multiplier which multiplies the sampled difference current by the ascertained difference in order to produce a control signal.

11. Apparatus according to claim 10, where the modulation circuit has a pulse width modulator which modulates the pulse widths of the clock pulses in the reference clock signal on the basis of the control signal produced in order to produce the spectrally shaped clock signal for the converter.

12. Apparatus according to claim 10, where the modulation circuit has
    a ring oscillator clocked by the reference clock signal adapted for producing an oscillator signal, and
    a multiplexer which switches through tapped-off signal phases of the oscillator signal on the basis of the control signal in order to produce the spectrally shaped clock signal for the converter.

13. Apparatus according to claim 5, where the converter is a current-controlled digital-analogue converter.

14. Apparatus according to claim 13, where the converter is contained in a continuous-time sigma-delta modulator.

15. Apparatus for spectrally shaping a reference clock signal for a converter, the apparatus comprising:
    (a) a clock signal jitter detection circuit adapted for detecting a clock signal jitter in the reference clock signal, where the clock signal jitter detection circuit outputs a discrete-time continuous-value sampling sequence whose amplitude values correspond to the detected clock signal jitter; and
    (b) a modulation circuit with an integrated signal delay line which delays the reference clock signal on the basis of the integrated clock signal jitter.

16. Apparatus according to claim 15, where an integrator is provided for integrating the sample sequence which is output by the clock signal jitter detection circuit.

17. Apparatus according to claim 16, where a signal amplifier is provided for amplifying the integrated sample sequence, and where the amplified integrated sample sequence is applied to the modulation circuit.

18. PLL circuit for producing a spectrally shaped clock signal, the PLL circuit comprising:
    a PLL (Phase Locked Loop) control loop which contains a voltage-controlled oscillator whose output signal is fed back via a clock signal jitter detection circuit for detecting a clock signal jitter in the output signal and forms the spectrally shaped clock signal,
    where a sinusoidal output signal from the voltage-controlled oscillator is amplified by a buffer signal amplifier in order to produce a square-wave clock signal, and
    where the voltage-controlled oscillator has a signal input for applying a summed signal which is output by an adder.

19. PLL circuit according to claim 18, where the summed signal is formed by adding a detected clock signal jitter signal which is output by the clock signal jitter detection circuit and a signal which is output by a loop filter in the PLL control loop.

20. PLL circuit for producing a spectrally shaped clock signal, the PLL circuit comprising:
    a PLL (Phase Locked Loop) control looP which contains a voltage-controlled oscillator whose output signal is fed back via a clock signal jitter detection circuit adapted for detecting a clock signal jitter in the output signal and forms the spectrally shaped clock signal, where the clock signal jitter detection circuit comprises:

(a) a switched-capacitor reference digital-analogue converter which is clocked by the reference clock signal and which converts an input signal into a first current;
(b) a current-controlled digital-analogue converter which is clocked by the reference clock signal and which converts the input signal into a second current; and having
(c) a current integrator which integrates the difference between the first current and the second current to produce a signal which indicates the clock signal jitter in the reference clock signal.

21. PLL circuit according to claim 20, where the clock signal jitter detection circuit also has a sampling switch for sampling the integrated difference current.

22. PLL circuit for producing a spectrally shaped clock signal, the PLL circuit comprising:
   a PLL (Phase Locked Loop) control loop which contains a voltage-controlled oscillator whose output signal is fed back via a clock signal jitter detection circuit adapted for detecting a clock signal jitter in the output signal and forms the spectrally shaped clock signal, where an input signal of the volate-controlled oscillator is constant.

23. PLL circuit according to claim 21, where the sampling switch outputs a discrete-time continuous-value sample sequence whose amplitude values correspond to the clock signal jitter in the spectrally shaped clock signal.

24. PLL circuit for producing a spectrally shaped clock signal, having: a PLL (Phase Locked Loop) control loop which contains a voltage-controlled oscillator whose output signal is fed back via a clock signal jitter detection circuit for detecting a clock signal jitter in the output signal and forms the spectrally shaped clock signal, where the PLL control loop comprises:
   a phase comparator adapted for comparing a phase of a clock signal produced by a reference clock generator and a phase of a feedback signal;
   a loop filter adapted for filtering an output signal from the phase comparator;
   an adder adapted for adding a signal which has been fed back by the clock jitter detection circuit to the signal filtered by the loop filter in order to produce a summed signal;
   a voltage-controlled oscillator adapted for producing a periodic output signal on the basis of the applied summed signal;
   a buffer signal amplifier which amplifies the periodic output signal in order to produce a square-wave clock signal; and
   a clock divider circuit which feeds back the clock signal produced by the buffer signal amplifier, having been divided by a division factor, to the phase comparator).

25. Voltage-controlled oscillator adapted producing a spectrally shaped periodic output signal which is amplified by a buffer signal amplifier in order to produce a square-wave clock signal which is fed back via a clock signal jitter detection circuit to a signal input of the voltage-controlled oscillator, where the clock signal jitter detection circuit comprises an integrator connected downstream of the clock signal jitter detection circuit.

26. Method for producing a clock signal, the method comprising:
   feeding back a periodic output signal from a voltage-controlled oscillator via a jitter detection circuit for detecting a signal jitter in the output signal to an input of the voltage-controlled oscillator; and
   producing, at the jitter detection circuits a signal which is dependent on a signal jitter change in the periodic output signal and which is integrated by an integrator.

27. Method according to claim 26, comprising adding, by an adder, the integrated signal to an input signal for the voltage-controlled oscillator.

28. Method according to claim 27, comprising amplifying, by a buffer signal amplifier, the periodic output signal to produce a square-wave clock signal.

* * * * *